(12) United States Patent
Folkmann

(10) Patent No.: US 7,570,932 B1
(45) Date of Patent: Aug. 4, 2009

(54) DUAL MODE QUADRATURE RADIO FREQUENCY POWER AMPLIFIER

(75) Inventor: Andrew F. Folkmann, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 483 days.

(21) Appl. No.: 11/548,907

(22) Filed: Oct. 12, 2006

(51) Int. Cl.
*H04B 1/04* (2006.01)
*H03F 3/68* (2006.01)

(52) U.S. Cl. ............... 455/127.1; 455/126; 455/91; 455/127.2; 330/295

(58) Field of Classification Search ... 455/552.1–553.1, 455/91–129; 330/295, 302, 124 R, 147, 330/148
See application file for complete search history.

(56) References Cited

U.S. PATENT DOCUMENTS

| | | | | |
|---|---|---|---|---|
| 5,025,485 A | * | 6/1991 | Csongor et al. | 455/91 |
| 5,770,970 A | * | 6/1998 | Ikeda et al. | 330/302 |
| 5,901,345 A | * | 5/1999 | Ikeda et al. | 455/127.2 |
| 7,054,597 B2 | * | 5/2006 | Rosnell | 330/124 R |
| 7,332,961 B2 | * | 2/2008 | Blednov | 330/124 R |
| 7,336,125 B2 | * | 2/2008 | Kyu et al. | 330/295 |
| 2006/0246855 A1 | * | 11/2006 | Kato et al. | 455/127.1 |

OTHER PUBLICATIONS

Anaren, Product literature for Model XC1900A-03 Hybrid Coupler 3dB, 90 degrees, "Xinger II," Anaren.

* cited by examiner

*Primary Examiner*—Lana N Le
(74) *Attorney, Agent, or Firm*—Withrow & Terranova, P.L.L.C.

(57) ABSTRACT

The present invention is a dual mode quadrature RF power amplifier system that is efficient and meets linearity requirements in both modes of operation. In a high power mode of operation, the power amplifier functions in a traditional manner, wherein both quadrature amplifier legs feed a quadrature power combiner to provide a combined RF output signal at an RF output. Any imbalanced signals are routed to an isolation output. In a low power mode of operation, one quadrature amplifier leg is disabled, which would normally cause the signal being fed from the enabled amplifier leg to be split between the two quadrature outputs; however, the impedance at the isolation output is shifted to reflect the isolation output signal back into the quadrature combiner to appear at the RF output. The impedance shift at the isolation output causes an impedance increase at the active input, thereby lowering output power.

20 Claims, 11 Drawing Sheets

DUAL MODE QUADRATURE RADIO FREQUENCY POWER AMPLIFIER

FIELD OF THE INVENTION

The present invention relates to radio frequency (RF) power amplifiers used in RF communications systems.

BACKGROUND OF THE INVENTION

Portable battery powered wireless communications devices, such as mobile terminals, cell phones, and the like, often have requirements to efficiently transmit information at different output power levels. As a result, RF transmitter power amplifiers need to transmit over a wide range of output power levels, while maintaining efficiency throughout the operating range. Traditional power amplifier designs may operate over a wide range of output power levels, but only achieve maximum efficiency at or near maximum output power. One approach for efficiently changing output power levels is incorporation of a dual mode power amplifier, which operates in either a high power output mode or a low power output. Dual mode power amplifiers may operate relatively efficiently in either mode; however, these dual mode power amplifiers require complex architectures and may have difficulty meeting linearity requirements.

Further, the output powers of single-path power amplifier designs may change with changing antenna loading conditions. The load sensitivity of a single-path amplifier is especially problematic at high power levels where the amplifier may not have the capability to maintain the desired output power into a mismatched load, or the amplifier may consume excessive current with a mismatched load, or both. The output powers of quadrature power amplifier designs tend to remain stable in the presence of changing antenna loading conditions. Therefore, there is a need for a dual mode quadrature RF power amplifier with a simple architecture that operates efficiently in both modes.

SUMMARY OF THE INVENTION

The present invention is a dual mode quadrature RF power amplifier system that is efficient and meets linearity requirements in both modes of operation. In a high power mode of operation, the power amplifier functions in a traditional manner, wherein both quadrature amplifier legs feed a quadrature power combiner to provide a combined RF output signal at an RF output. Any imbalanced signals are routed to an isolation output. Both outputs may be nominally terminated. In a low power mode of operation, one quadrature amplifier leg is disabled, which would normally cause the signal being fed from the enabled amplifier leg to be split between the two quadrature outputs. However, in the low power mode of operation, the impedance at the isolation output is shifted to reflect the isolation output signal back into the quadrature combiner to appear at the RF output. The impedance shift at the isolation output causes an impedance increase at the active input.

The combination of eliminating power from one of the amplifier legs and the resulting impedance increase at the active input reduces output power by approximately 6 db without a significant degradation of efficiency in either mode of operation. The present invention improves over existing dual mode PA designs by eliminating switching circuitry in the main signal path, thereby increasing efficiency. Certain embodiments of the present invention add an impedance at the inactive input, which may further increase the input impedance at the active input, thereby resulting in a further output power reduction. Some embodiments of the present invention include a DC-to-DC converter to provide a DC supply voltage to a power amplifier final stage.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a dual mode quadrature RF power amplifier system that is efficient and meets linearity requirements in both modes of operation. In a high power mode of operation, the power amplifier functions in a traditional manner, wherein both quadrature amplifier legs feed a quadrature power combiner to provide a combined RF output signal at an RF output. Any imbalanced signals are routed to an isolation output. Both outputs may be nominally terminated. In a low power mode of operation, one quadrature amplifier leg is disabled, which would normally cause the signal being fed from the enabled amplifier leg to be split between the two quadrature outputs. However, in the low power mode of operation, the impedance at the isolation output is shifted to reflect the isolation output signal back into the quadrature combiner to appear at the RF output. The impedance shift at the isolation output causes an impedance increase at the active input.

The combination of eliminating power from one of the amplifier legs and the resulting impedance increase at the active input reduces output power by approximately 6 db without a significant degradation of efficiency in either mode of operation. The present invention improves over existing dual mode PA designs by eliminating switching circuitry in the main signal path, thereby increasing efficiency. Certain embodiments of the present invention add an impedance at the inactive input, which may further increase the input impedance at the active input, thereby resulting in a further output power reduction. Although the difference in output power between the high power mode of operation and the low power mode of operation may exceed 6 db, some applications require operating efficiently from +10 db milliwatts (dbm) to +30 dbm, or a power range of 20 db. By powering a final stage of the dual mode quadrature power amplifier with a DC-to-DC converter, a power range of 20 db may be feasible. Certain embodiments of the present invention include a DC-to-DC converter to provide a DC supply voltage to the power amplifier final stage.

Figure 1:
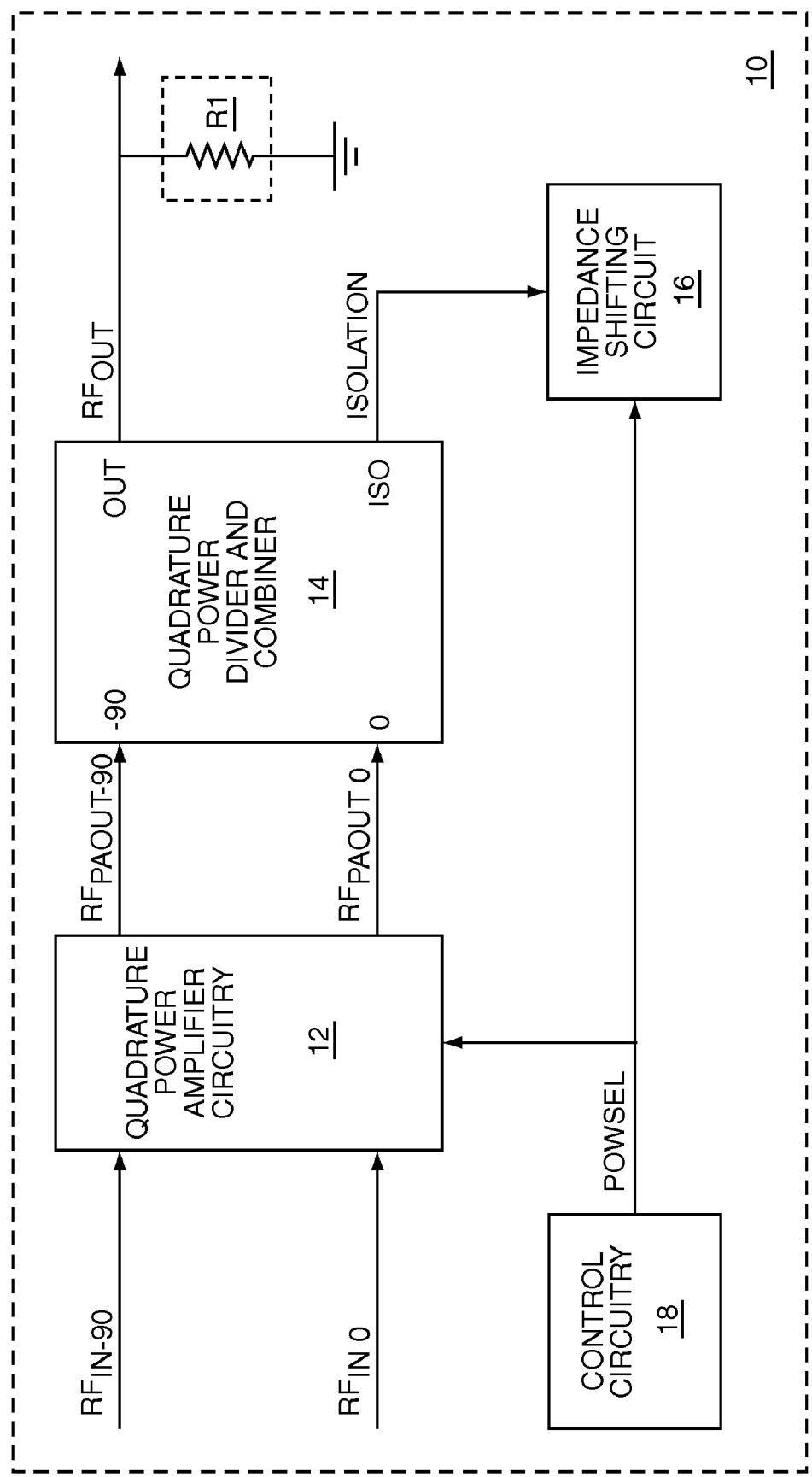
FIG. 1 shows one embodiment of the present invention used in a quadrature power amplifier system.

FIG. 1 shows the present invention used in a quadrature power amplifier system 10. Quadrature power amplifier circuitry 12 receives a −90 degree RF input signal $RF_{-90}$ and a zero degree RF input signal $RF_{IN\ 0}$. The quadrature power amplifier circuitry 12 amplifies the RF input signals $RF_{IN-90}$, $RF_{IN\ 0}$ to create an −90 degree RF power amplifier output signal $RF_{PAOUT-90}$ and a zero degree RF power amplifier output signal $RF_{PAOUT\ 0}$, which then feed a −90 degree input −90 and a zero degree input 0 of a quadrature power divider and combiner 14. The quadrature power divider and combiner 14 provides an RF output signal $RF_{OUT}$, from an RF output OUT, which is used to drive antenna circuitry or other downstream circuitry. The loading of the RF output OUT may be represented as a termination resistor R1, which may be approximately 50 ohms. The quadrature power divider and combiner 14 provides an isolation output signal ISOLATION, from an isolation output ISO, which is coupled to an impedance shifting circuit 16. Control circuitry 18 provides a power control signal POWSEL to the quadrature power amplifier circuitry 12 and the impedance shifting circuit 16 to select between the low power mode of operation and the high power mode of operation. The control circuitry 18 provides the power control signal POWSEL based on output power information, which may include output power status and power mode switching threshold information.

In the high power mode of operation, the quadrature power amplifier circuitry 12 provides the −90 degree and zero degree RF power amplifier output signals $RF_{PAOUT-90}$, $RF_{PAOUT\ 0}$, which are phase-shifted from each other by approximately 90 degrees. In the low power mode of operation, the quadrature power amplifier circuitry 12 provides only the zero degree RF power amplifier output signal $RF_{PAOUT\ 0}$, wherein the amplitude of the −90 degree RF power amplifier output signal $RF_{PAOUT-90}$ is essentially zero. In another embodiment of the present invention, in the low power mode of operation, the quadrature power amplifier circuitry 12 provides only the −90 degree RF power amplifier output signal $RF_{PAOUT-90}$.

The present invention takes advantage of certain behavioral characteristics of commonly used quadrature power divider and combiners 14. When the −90 degree and zero degree inputs −90 and 0 are fed with two equal amplitude quadrature input signals, as during the high power mode of operation, the quadrature power divider and combiner 14 behaves as a power combiner by phase-shifting and combining the input signals to create a combined RF output signal to the RF output OUT. Normally, the −90 degree RF power amplifier output signal $RF_{PAOUT-90}$ lags the zero degree RF power amplifier output signal $RF_{PAOUT\ 0}$ by approximately 90 degrees. Normally, no signals appear at the isolation output ISO; however, imbalanced input signals may appear at the isolation output ISO.

When only one of the quadrature power divider and combiner 14 inputs is fed with an input signal, as during the low power mode of operation, the quadrature power divider and combiner 14 behaves as a power divider by dividing the input signal into two output signals while imparting a 90 degree phase shift to one of the output signals with respect to the other output signal. The two output signals are provided at the outputs OUT, ISO. If an appropriate impedance is presented to the isolation output ISO, the output signal being provided at the isolation output ISO will be reflected back into the isolation output ISO, and then phase-shifted and combined with the output signal being provided at the RF output OUT with minimal signal loss. In the low power mode of operation, the impedance shifting circuit 16 presents the appropriate impedance, called the low power mode impedance, to the isolation output ISO.

In the high power mode of operation, the impedance shifting circuit 16 may present a termination impedance, called the high power mode impedance, to the isolation output ISO. The high power mode impedance may be approximately 50 ohms. The low power mode impedance may be either approximately an open circuit or a short circuit, depending on which output of the quadrature power amplifier circuitry 12 is disabled during the low power mode of operation.

Figure 2:
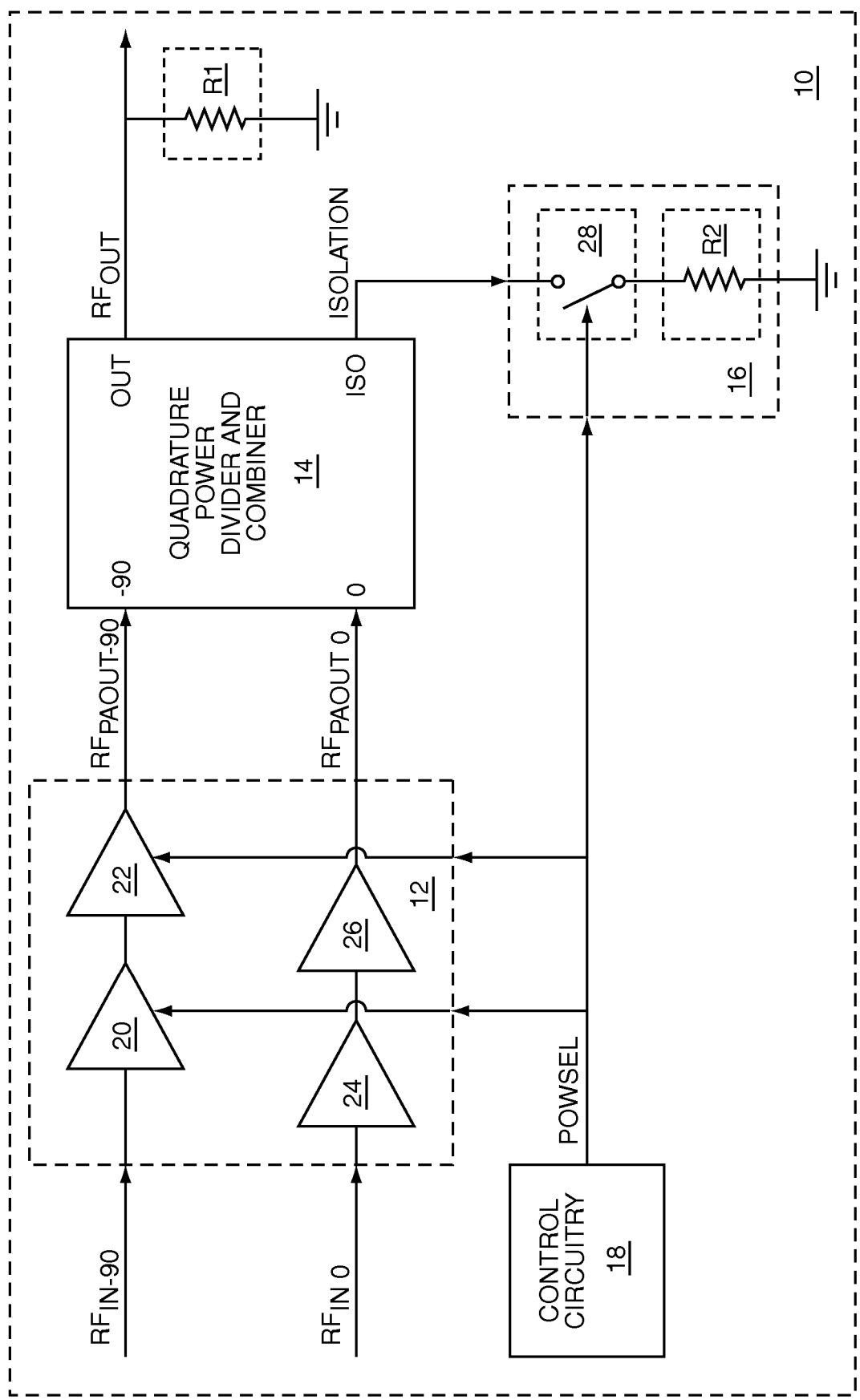
FIG. 2 shows a first embodiment of the present invention with a specific impedance shifting circuit used in the quadrature power amplifier system 10 shown in FIG. 1.

FIG. 2 shows a first embodiment of the present invention used in the quadrature power amplifier system 10 shown in FIG. 1. The quadrature power amplifier circuitry 12 may include −90 degree driver circuitry 20 with one or more amplifier stages feeding a −90 degree final stage 22, which provides the −90 degree RF power amplifier output signal $RF_{PAOUT-90}$ from a −90 degree power amplifier output. The quadrature power amplifier circuitry 12 may also include zero degree driver circuitry 24 with one or more amplifier stages feeding a zero degree final stage 26, which provides the zero degree RF power amplifier output signal $RF_{PAOUT\ 0}$ from a zero degree power amplifier output. The −90 degree driver circuitry 20 and the −90 degree final stage 22 receive the power control signal POWSEL, which enables the −90 degree power amplifier output during the high power mode of operation, and disables the −90 degree power amplifier output during the low power mode of operation. The −90 degree power amplifier output may be disabled by disabling DC bias to the −90 degree final stage 22. An amplitude of the disabled DC bias may be essentially zero. Other embodiments of the present invention may disable the −90 degree power amplifier output using other techniques. The disabled −90 degree power amplifier output may exhibit a high output impedance. Part or all of the circuitry inside the −90 degree driver circuitry 20 and the −90 degree final stage 22 may be powered down during the low power mode of operation to conserve power.

The impedance shifting circuit 16 may include a zero degree termination resistor R2 in series with an impedance select switch 28. During the low power mode of operation, the impedance select switch 28 is open, thereby presenting substantially an open circuit to the isolation output ISO. During the high power mode of operation, the impedance select switch 28 is closed, thereby presenting the high power mode impedance, which may be approximately 50 ohms, to the isolation output ISO. The high power mode impedance is approximately the sum of the resistance of the zero degree termination resistor R2 and the closed resistance of the impedance select switch 28, which allows use of a switch with a relatively high resistance when in a closed configuration.

Figure 3:
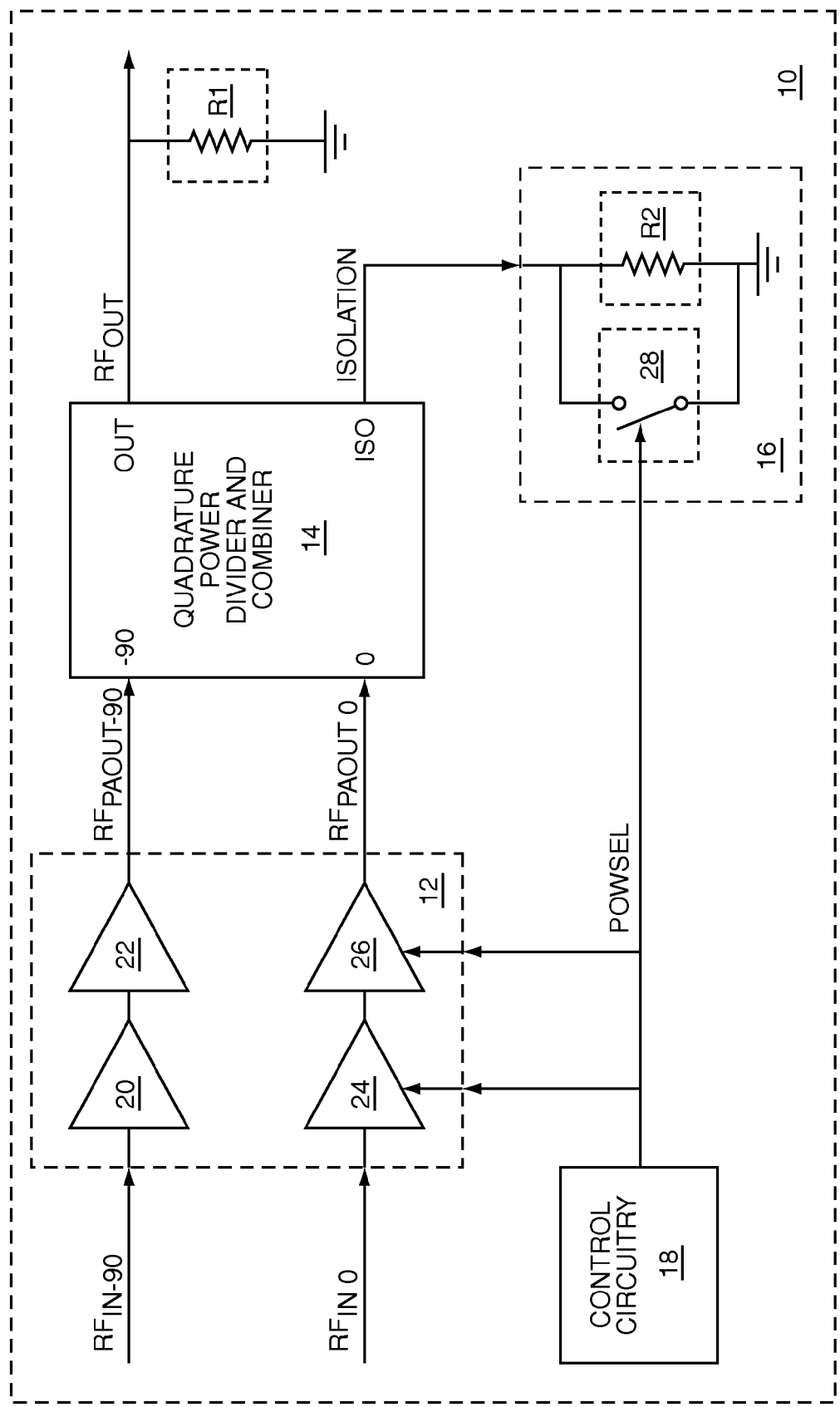
FIG. 3 shows a second embodiment of the present invention with another impedance shifting circuit used in the quadrature power amplifier system 10 shown in FIG. 1.

FIG. 3 shows a second embodiment of the present invention used in the quadrature power amplifier system 10 shown in FIG. 1. The zero degree driver circuitry 24 and the zero degree final stage 26 receive the power control signal POWSEL, which enables the zero degree power amplifier output during the high power mode of operation, and disables the zero degree power amplifier output during the low power mode of operation. The impedance shifting circuit 16 may include the zero degree termination resistor R2 in parallel with the impedance select switch 28. During the low power mode of operation, the impedance select switch 28 is closed, thereby presenting substantially a closed circuit to the isolation output ISO. During the high power mode of operation, the impedance select switch 28 is open, thereby presenting the resistance of the zero degree termination resistor R2, which may be approximately 50 ohms, to the isolation output ISO. The low power mode impedance is approximately the closed resistance of the impedance select switch 28.

Figure 4:
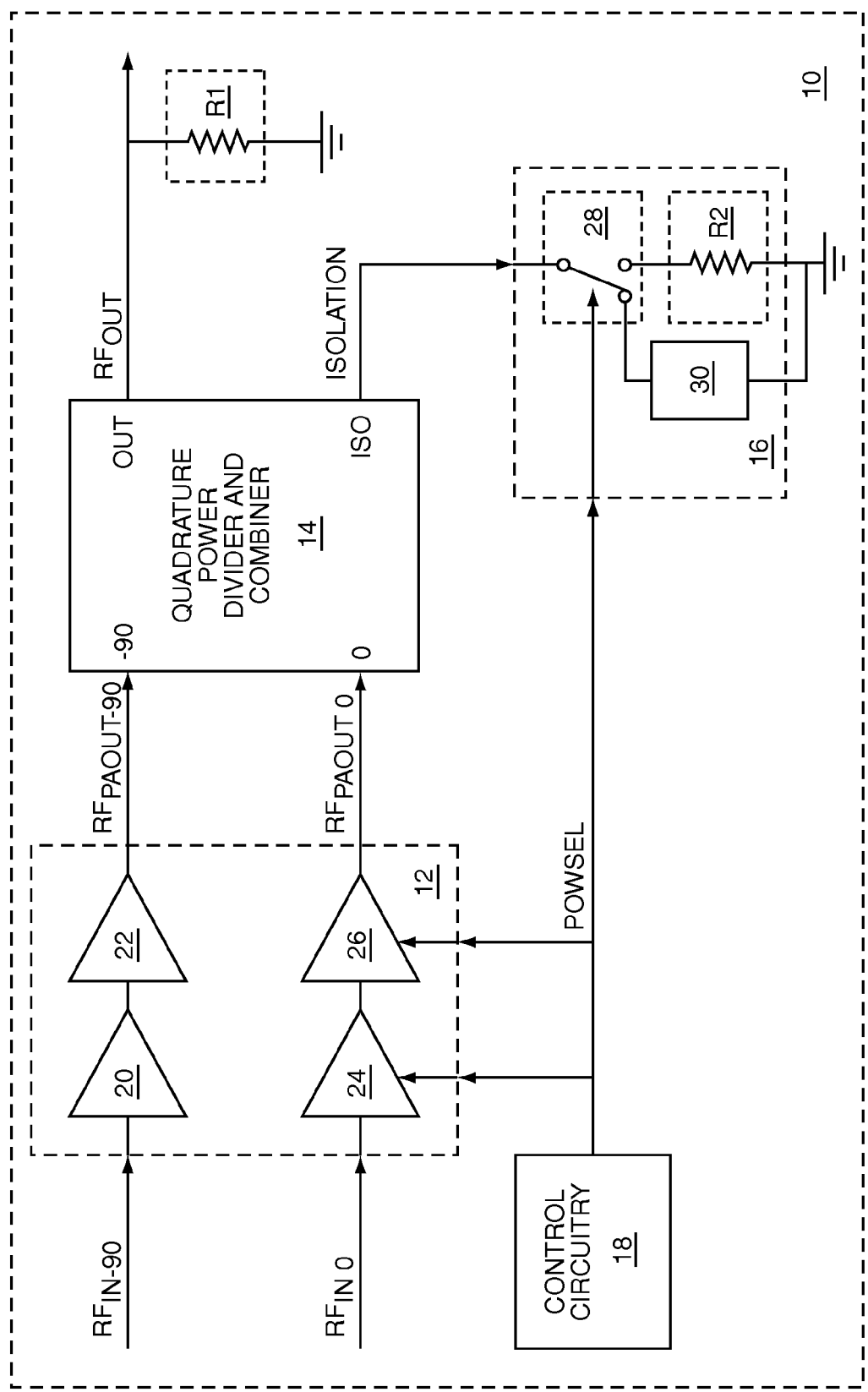
FIG. 4 shows a third embodiment of the present invention with another impedance shifting circuit used in the quadrature power amplifier system shown in FIG. 1.

FIG. 4 shows a third embodiment of the present invention used in the quadrature power amplifier system 10 shown in FIG. 1. The impedance shifting circuit 16 may include the impedance select switch 28, which selects between the zero degree termination resistor R2 and a low power mode impedance network 30. During the low power mode of operation, the impedance select switch 28 selects the low power mode impedance network 30, thereby presenting the low power mode impedance, which is approximately the sum of an impedance of the low power mode impedance network 30 and the resistance of the impedance select switch 28, to the isolation output ISO. During the high power mode of operation, the impedance select switch 28 selects the zero degree termination resistor R2, thereby presenting the high power mode impedance, which may be approximately 50 ohms, to the isolation output ISO. The high power mode impedance is approximately the sum of the resistance of the zero degree termination resistor R2 and the resistance of the impedance select switch 28.

Another behavioral characteristic of commonly used quadrature power divider and combiners 14 is when switching from the high power mode of operation to the low power mode of operation, the input impedance of the −90 degree input −90 increases. An impedance ratio is the ratio of the input impedance of the −90 degree input −90 during the low power mode of operation divided by the input impedance of the −90 degree input −90 during the high power mode of operation. For example, if the high power mode impedance is 50 ohms and the load presented to the RF output OUT is 50 ohms, then the input impedance of the −90 degree input −90 may be 50 ohms during the high power mode of operation. However, if the low power mode impedance is an open circuit, then during the low power mode of operation, the input impedance of the −90 degree input −90 may be 100 ohms, which provides an impedance ratio of 2. By doubling the input impedance, and driving only one of the amplifier legs during the low power mode of operation, the output power of the RF output OUT may be reduced by a factor of 4, or 6 db. Since no significant signal losses were introduced either during the low power mode of operation or during the high power mode of operation, high efficiency can be maintained in both modes of operation. In many typical applications, the impedance ratio may be approximately 2. For those applications that need an output power difference between the low power mode of operation and the high power mode of operation of greater than 6 db, an impedance ratio greater than 2 is beneficial.

Figure 5:
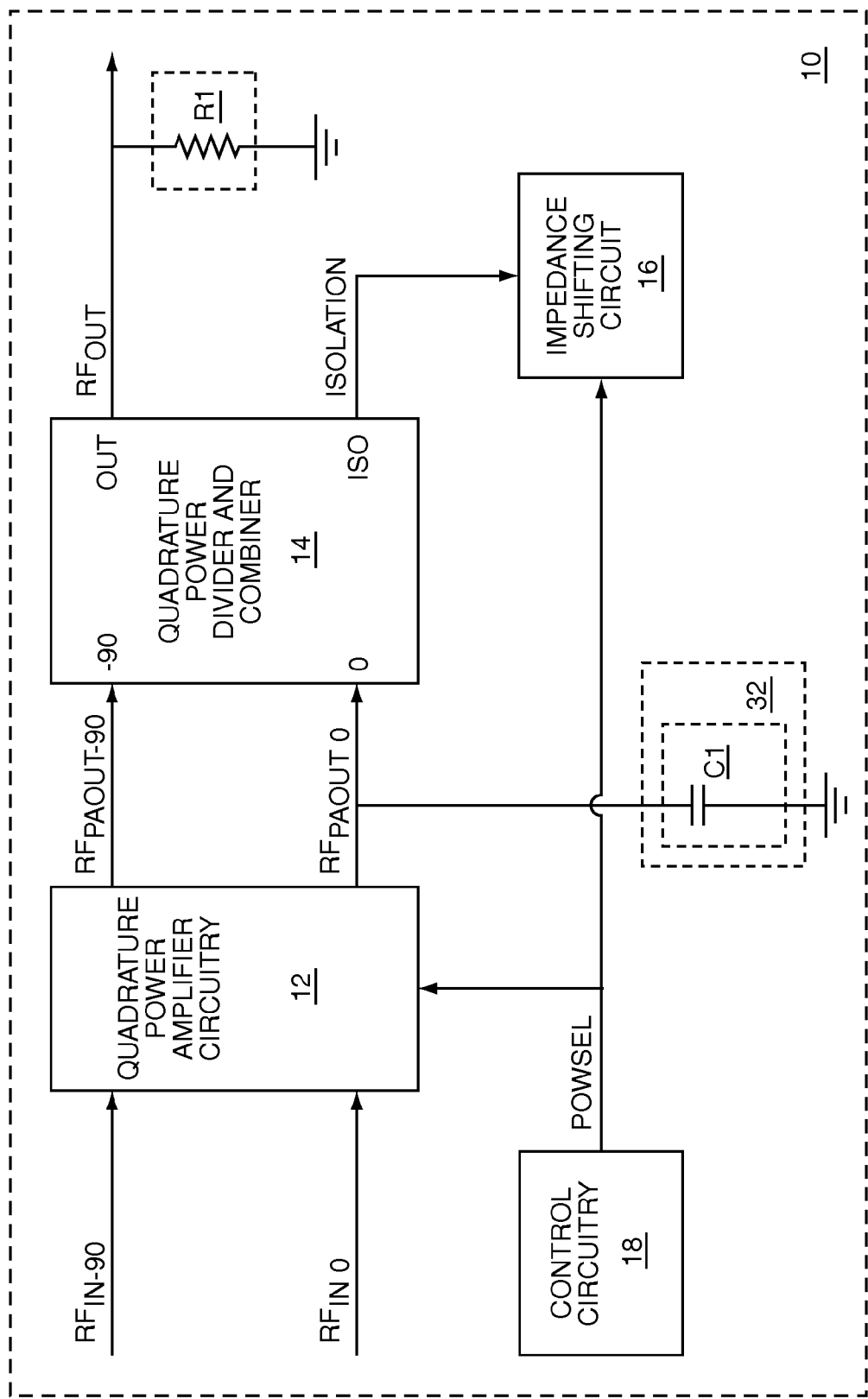
FIG. 5 shows one embodiment of the quadrature power amplifier system of FIG. 1, which adds a reactive circuit.

By coupling a reactive circuit 32 to the zero degree input 0, impedance ratios greater than 2 can be realized, as shown in FIG. 5. The reactive circuit 32 presents a reactive impedance, called the zero degree input impedance, to the zero degree input 0 during the low power mode of operation. By using an appropriate low power mode impedance, the output signal being provided at the isolation output ISO will be substantially reflected back into the isolation output ISO. Since the zero degree input impedance is reactive, the low power mode impedance may be complex, and may include resistive elements, inductive elements, capacitive elements, or any combination thereof, instead of a short circuit or open circuit. In the embodiment illustrated in FIG. 5, the reactive circuit 32 includes a capacitive element C1. In other embodiments of the present invention, a complex low power mode impedance may be used to compensate for residual capacitances that may appear at the zero degree input 0 during the low power mode of operation, such as the output capacitance from a disabled zero degree power amplifier output.

Figure 6:
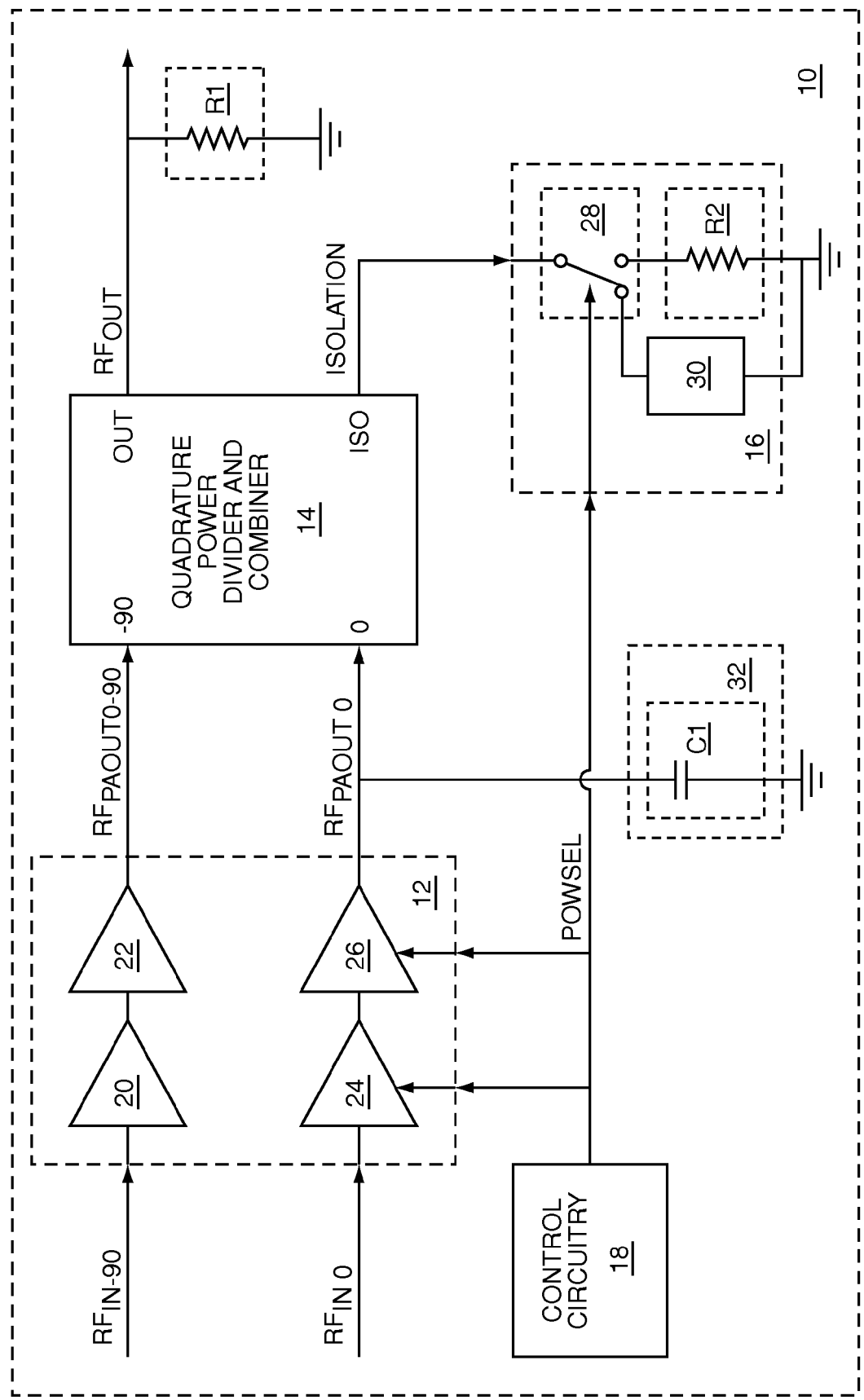
FIG. 6 shows a fourth embodiment of the present invention that adds the reactive circuit of FIG. 5 to the embodiment illustrated in FIG. 4.

FIG. 6 shows a fourth embodiment of the present invention by adding the reactive circuit 32 of FIG. 5 to the third embodiment illustrated in FIG. 4. In the low power mode of operation, the low power mode impedance network 30 provides the appropriate low power mode impedance such that the output signal being provided at the isolation output ISO will be substantially reflected back into the isolation output ISO.

Figure 7:
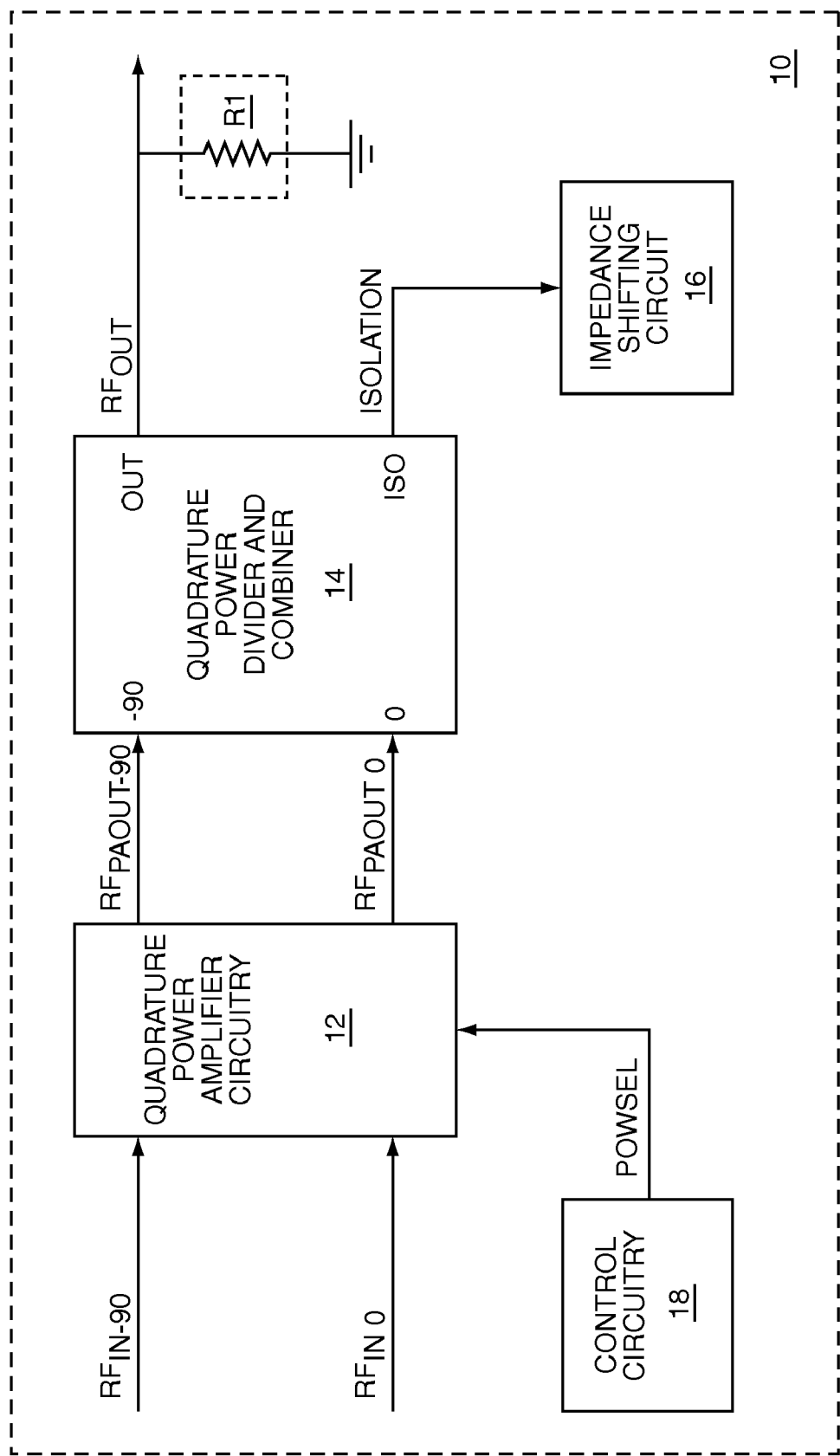
FIG. 7 shows the present invention used in a quadrature power amplifier system with a fixed impedance shifting circuit.

FIG. 7 shows the present invention used in a quadrature power amplifier system 10 with a fixed impedance shifting circuit 16, which presents the low power mode impedance to the isolation output ISO regardless of which operating mode is selected. In this case, the impedance shifting circuit 16 does not receive the power control signal POWSEL. In the high power mode of operation, only unbalanced signals are routed to the isolation output ISO; therefore, this configuration may be acceptable for some applications.

Figure 8:
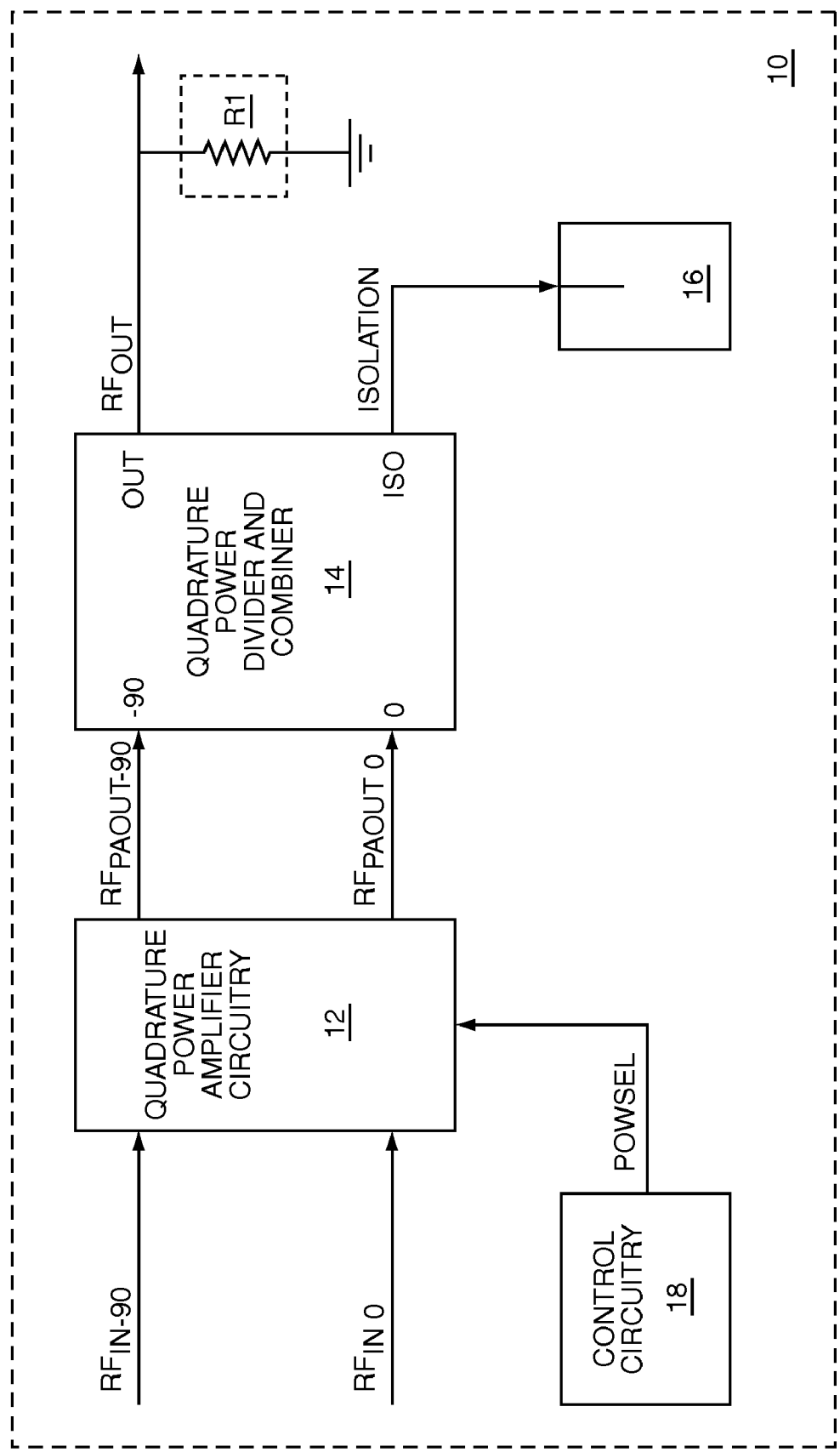
FIG. 8 shows a fifth embodiment of the present invention used in the quadrature power amplifier system shown in FIG. 7, wherein the fixed impedance shifting circuit is substantially an open circuit.

FIG. 8 shows a fifth embodiment of the present invention used in the quadrature power amplifier system 10 shown in FIG. 7, wherein the fixed impedance shifting circuit 16 is substantially an open circuit.

Figure 9:
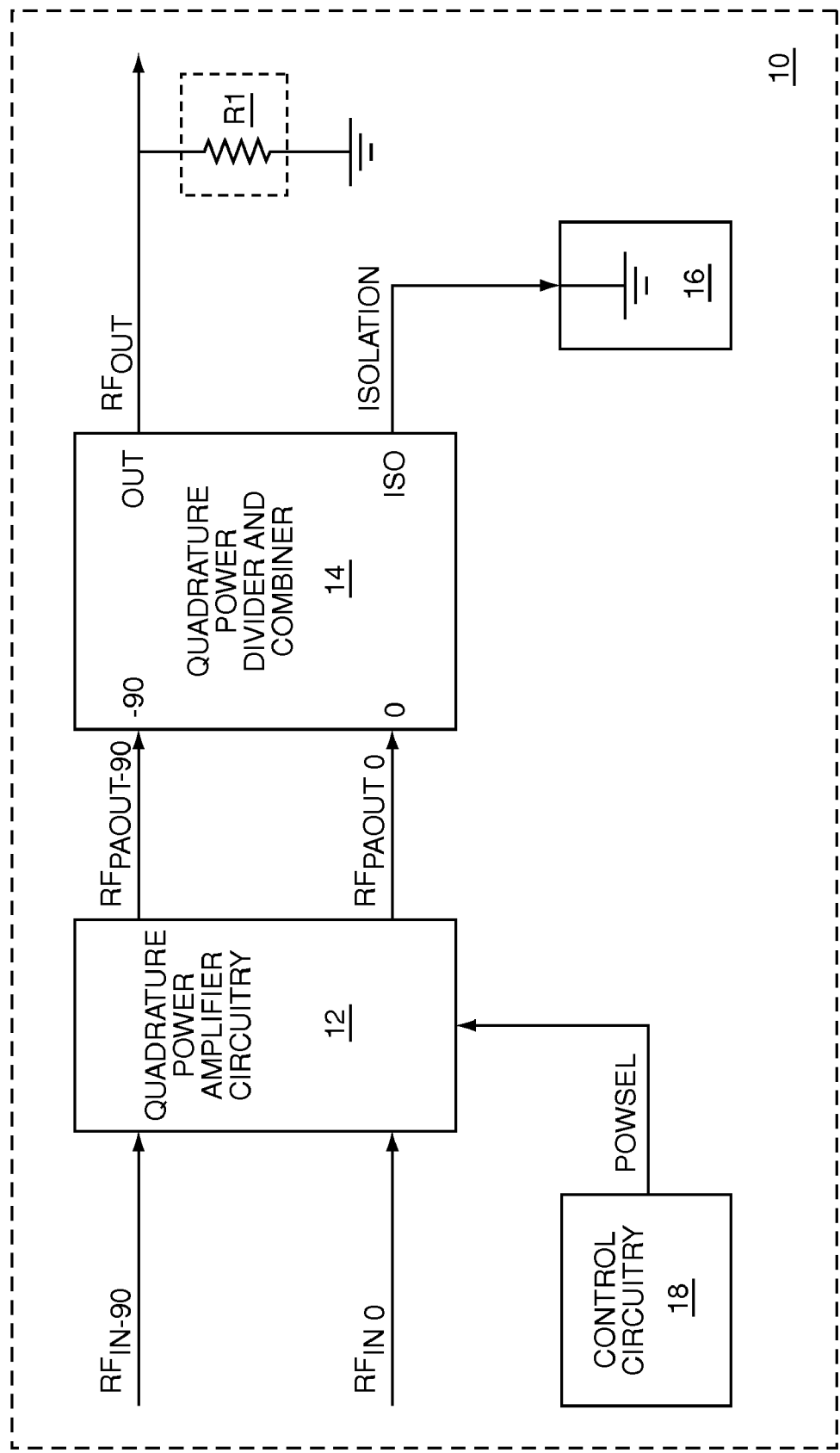
FIG. 9 shows a sixth embodiment of the present invention used in the quadrature power amplifier system shown in FIG. 7, wherein the fixed impedance shifting circuit is substantially a short circuit.

FIG. 9 shows a sixth embodiment of the present invention used in the quadrature power amplifier system 10 shown in FIG. 7, wherein the fixed impedance shifting circuit 16 is substantially a short circuit.

Figure 10:
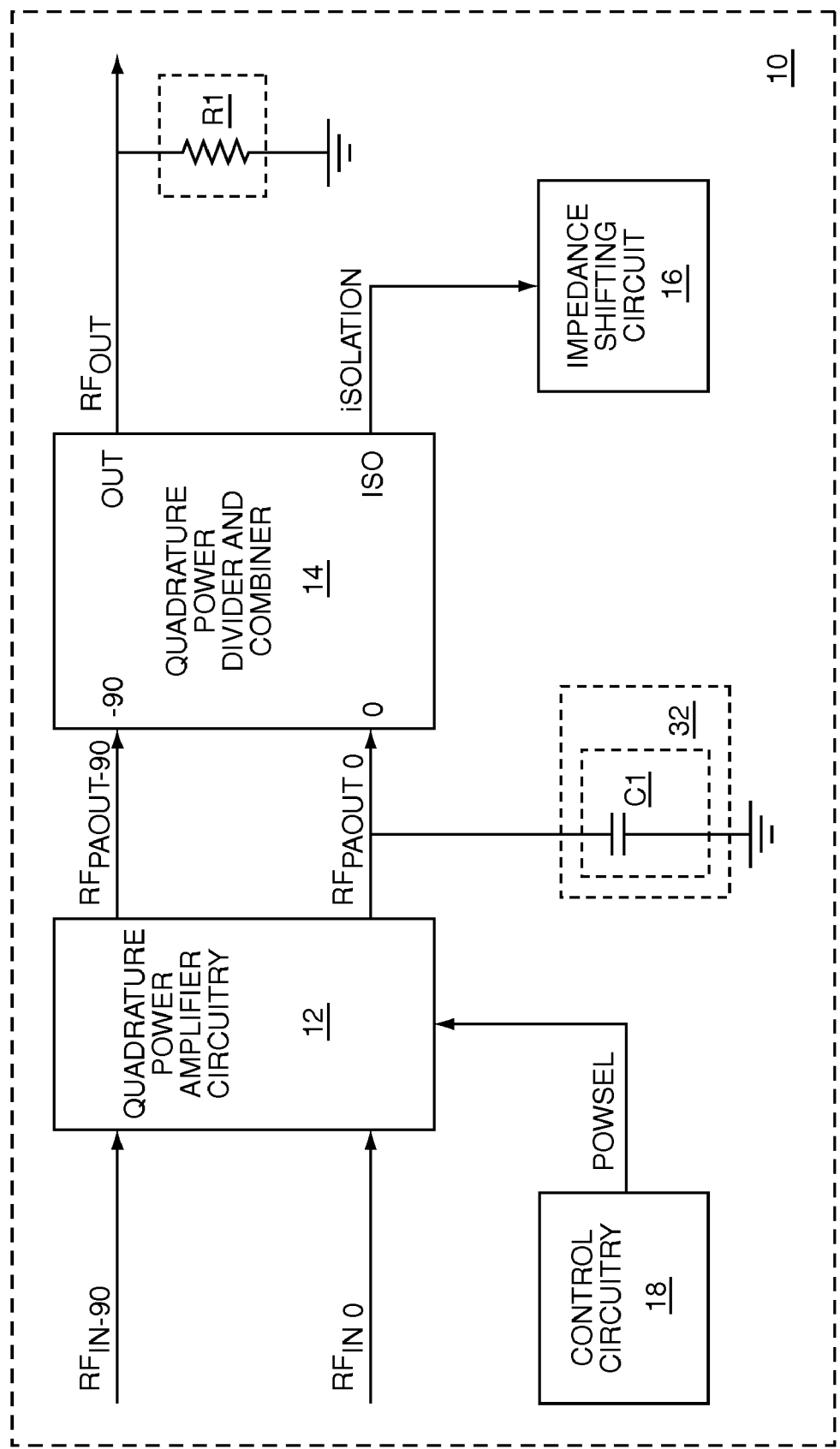
FIG. 10 shows a seventh embodiment of the present invention that adds the reactive circuit of FIG. 5 to the quadrature power amplifier system shown in FIG. 7.

FIG. 10 shows a seventh embodiment of the present invention by adding the reactive circuit 32 of FIG. 5 to the quadrature power amplifier system 10 shown in FIG. 7. In the low power mode of operation, the impedance shifting circuit 16 provides the appropriate low power mode impedance such that the output signal being provided at the isolation output ISO will be substantially reflected back into the isolation output ISO.

A number of different commonly available architectures may be suitable for the quadrature power divider and combiner 14, including but not limited to coupled transmission lines, a lumped element equivalent of coupled transmission lines, a Lange coupler, a lumped element equivalent of a Lange coupler, in-phase combiners coupled to phase shift networks, directional branchline couplers, or directional overlay couplers. The quadrature power divider and combiner 14 may include stripline technology, lumped elements, or both. One commercially available quadrature power divider and combiner 14 is Hybrid Coupler Model XC1900A-03 provided by Anaren.

Figure 11:
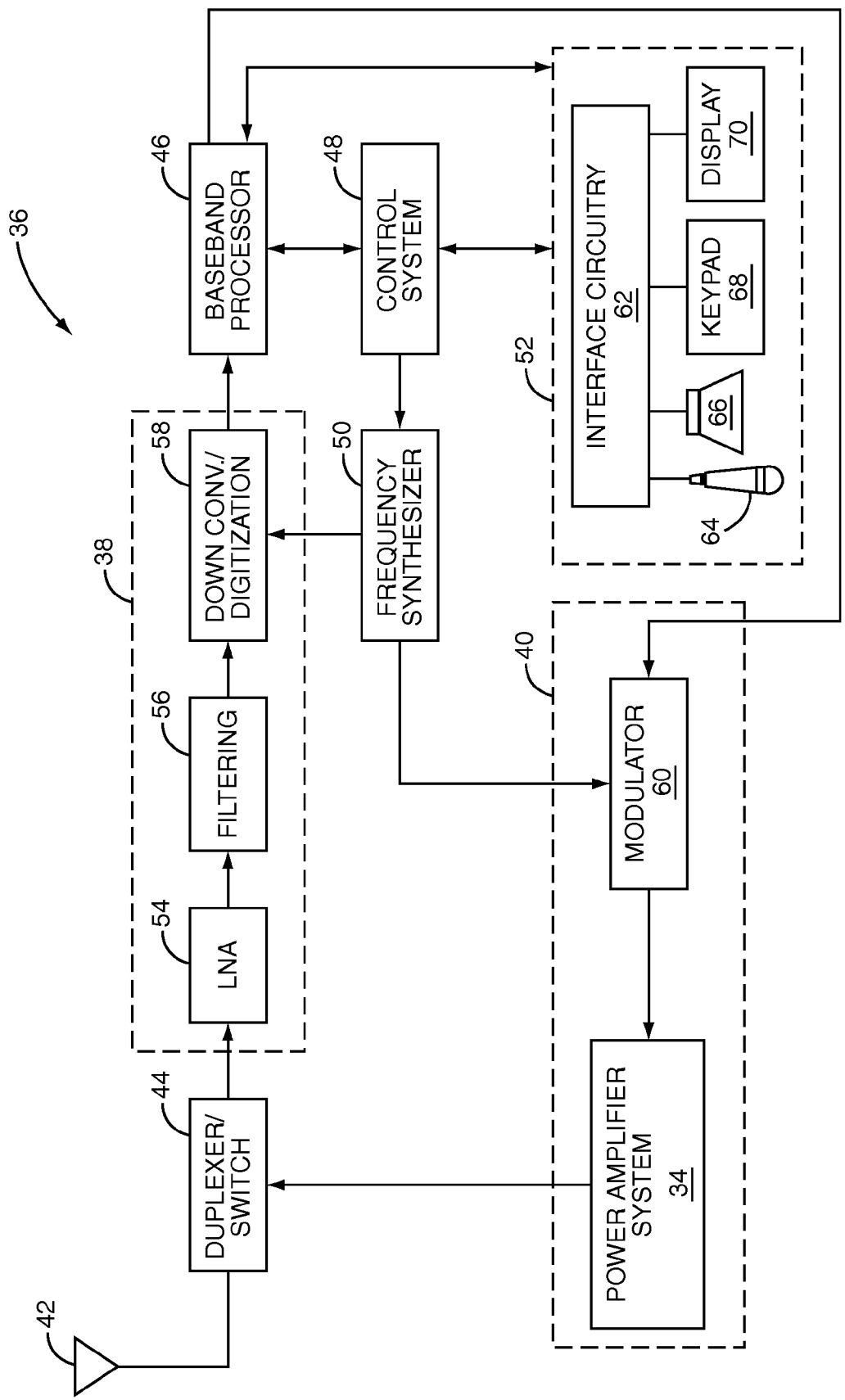
FIG. 11 shows an application example of the present invention used in a mobile terminal.

An application example of a quadrature RF power amplifier is its use in a power amplifier system 34 in a mobile terminal 36. The basic architecture of the mobile terminal 36 is represented in FIG. 11 and may include a receiver front end 38, a radio frequency transmitter section 40, an antenna 42, a duplexer or switch 44, a baseband processor 46, a control system 48, a frequency synthesizer 50, and an interface 52. The receiver front end 38 receives information bearing radio frequency signals from one or more remote transmitters provided by a base station. A low noise amplifier (LNA) 54 amplifies the signal. A filter circuit 56 minimizes broadband interference in the received signal, while down conversion and digitization circuitry 58 downconverts the filtered, received signal to an intermediate or baseband frequency signal, which is then digitized into one or more digital streams. The receiver front end 38 typically uses one or more mixing frequencies generated by the frequency synthesizer 50. The baseband processor 46 processes the digitized received signal to extract the information or data bits conveyed in the received signal. This processing typically comprises demodulation, decoding, and error correction operations. As such, the baseband processor 46 is generally implemented in one or more digital signal processors (DSPs).

On the transmit side, the baseband processor 46 receives digitized data, which may represent voice, data, or control information, from the control system 48, which it encodes for transmission. The encoded data is output to the transmitter 40, where it is used by a modulator 60 to modulate a carrier signal that is at a desired transmit frequency. The power amplifier system 34 receives power mode switching threshold information from the baseband processor 46, selects either the high power mode or the low power mode, and then amplifies the modulated carrier signal to a level appropriate for transmission. The power amplifier system 34 delivers the amplified and modulated carrier signal to the antenna 42 through the duplexer or switch 44.

A user may interact with the mobile terminal 36 via the interface 52, which may include interface circuitry 62 associated with a microphone 64, a speaker 66, a keypad 68, and a display 70. The interface circuitry 62 typically includes analog-to-digital converters, digital-to-analog converters, amplifiers, and the like. Additionally, it may include a voice encoder/decoder, in which case it may communicate directly with the baseband processor 46. The microphone 64 will typically convert audio input, such as the user's voice, into an electrical signal, which is then digitized and passed directly or indirectly to the baseband processor 46. Audio information encoded in the received signal is recovered by the baseband processor 46, and converted by the interface circuitry 62 into an analog signal suitable for driving the speaker 66. The keypad 68 and display 70 enable the user to interact with the mobile terminal 36, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) system capable of operating in one of a first mode and a second mode comprising:
   quadrature power amplifier circuitry adapted to:
      when operating in the first mode, provide a first amplifier signal;
      when operating in the second mode, provide the first amplifier signal and a second amplifier signal; and
      select one of the first mode and the second mode based on a power control signal;
   a quadrature power divider and combiner circuit adapted to:
      when operating in the first mode, receive, divide, and phase-shift the first amplifier signal into two first mode output signals of approximately equal amplitude, which are phase-shifted approximately 90 degrees from each other; and
      when operating in the second mode, receive, phase-shift, and combine the first amplifier signal and the second amplifier signal into a second mode output signal;
   an impedance shifting circuit coupled to the quadrature power divider and combiner circuit, which when operating in the first mode is adapted to present an impedance to the quadrature power divider and combiner circuit that causes one of the two first mode output signals to be substantially reflected, phase-shifted, and combined with the other of the two first mode output signals to create a combined first mode output signal; and
   control circuitry adapted to provide the power control signal.

2. The RF system of claim 1 wherein when operating in the first mode:
   the quadrature power amplifier circuitry is adapted to provide the second amplifier signal, wherein an amplitude of the second amplifier signal is essentially zero; and
   the quadrature power divider and combiner circuit is adapted to receive the second amplifier signal.

3. The RF system of claim 2 wherein:
   the quadrature power divider and combiner circuit further comprises a divider and combiner input adapted to receive the second amplifier signal; and
   the quadrature power amplifier circuitry further comprises:
      a final stage adapted to provide a power amplifier output, wherein the power amplifier output is adapted to provide the second amplifier signal; and
      bias circuitry adapted to provide direct current (DC) bias to the final stage, wherein when operating in the first mode, the DC bias is disabled.

4. The RF system of claim 2 wherein:
   the quadrature power amplifier circuitry further comprises a power amplifier output adapted to provide the second amplifier signal; and
   the quadrature power divider and combiner circuit further comprises a divider and combiner input adapted to receive the second amplifier signal,
   wherein when operating in the first mode, the power amplifier output is disabled.

5. The RF system of claim 1 wherein the quadrature power divider and combiner circuit further comprises an isolation output coupled to the impedance shifting circuit, and:
   when operating in the first mode, the isolation output provides the one of the two first mode output signals to be substantially reflected, phase-shifted, and combined with the other of the two first mode output signals; and when operating in the second mode, the second amplifier signal is phase-shifted from the first amplifier signal by approximately 90 degrees.

6. The RF system of claim 5 wherein the impedance shifting circuit is further adapted to:
when operating in the first mode, present the impedance to the quadrature power divider and combiner circuit that causes the one of the two first mode output signals to be substantially reflected, phase-shifted, and combined with the other of the two first mode output signals;
when operating in the second mode, present a nominal impedance to the quadrature power divider and combiner circuit; and
select one of the first mode and the second mode based on the power control signal.

7. The RF system of claim 6 wherein:
the quadrature power divider and combiner circuit further comprises a first input adapted to receive the first amplifier signal;
when operating in the first mode, the impedance to the quadrature power divider and combiner circuit that causes the one of the two first mode output signals to be substantially reflected, phase-shifted, and combined with the other of the two first mode output signals contributes to a first mode first input impedance at the first input; and
when operating in the second mode, the nominal impedance contributes to a second mode first input impedance at the first input,
wherein the first mode first input impedance is greater than the second mode first input impedance.

8. The RF system of claim 6 wherein the nominal impedance is less than the impedance to the quadrature power divider and combiner circuit that causes the one of the two first mode output signals to be substantially reflected, phase-shifted, and combined with the other of the two first mode output signals.

9. The RF system of claim 6 wherein the nominal impedance is greater than the impedance to the quadrature power divider and combiner circuit that causes the one of the two first mode output signals to be substantially reflected, phase-shifted, and combined with the other of the two first mode output signals.

10. The RF system of claim 6 wherein the impedance presented to the quadrature power divider and combiner circuit that causes the one of the two first mode output signals to be substantially reflected, phase-shifted, and combined with the other of the two first mode output signals is substantially a short circuit.

11. The RF system of claim 6 wherein the impedance presented to the quadrature power divider and combiner circuit that causes the one of the two first mode output signals to be substantially reflected, phase-shifted, and combined with the other of the two first mode output signals is substantially an open circuit.

12. The RF system of claim 6 wherein when operating in the first mode, the impedance shifting circuit further comprises at least one of a resistive element, an inductive element, and a capacitive element adapted to present the impedance presented to the quadrature power divider and combiner circuit that causes the one of the two first mode output signals to be substantially reflected, phase-shifted, and combined with the other of the two first mode output signals.

13. The RF system of claim 6 wherein:
the quadrature power divider and combiner circuit further comprises a divider and combiner input adapted to receive the second amplifier signal; and
the RF system further comprises a reactive circuit that is coupled to the divider and combiner input.

14. The RF system of claim 13 wherein the reactive circuit further comprises a capacitive element.

15. The RF system of claim 13 wherein when operating in the first mode, the impedance shifting circuit further comprises at least one of a resistive element, an inductive element, and a capacitive element adapted to present the impedance presented to the quadrature power divider and combiner circuit that causes the one of the two first mode output signals to be substantially reflected, phase-shifted, and combined with the other of the two first mode output signals.

16. The RF system of claim 5 wherein the impedance shifting circuit is further adapted to present a fixed impedance to the quadrature output when operating in the first mode and when operating in the second mode.

17. The RF system of claim 16 wherein the fixed impedance is substantially a short circuit.

18. The RF system of claim 16 wherein the fixed impedance is substantially an open circuit.

19. The RF system of claim 16 wherein the impedance shifting circuit further comprises at least one of a resistive element, an inductive element, and a capacitive element adapted to provide the fixed impedance.

20. The RF system of claim 1 further comprising a DC-to-DC converter adapted to provide a DC supply voltage to the quadrature power amplifier circuitry.

* * * * *